United States Patent [19]

Gregor

[11] Patent Number: 4,745,044
[45] Date of Patent: May 17, 1988

[54] MULTILAYER RESISTS WITH IMPROVED SENSITIVITY AND REDUCED PROXIMITY EFFECT

[75] Inventor: Lawrence V. Gregor, Hopewell Junction, N.Y.

[73] Assignee: International Business Machines Corporation, Armonk, N.Y.

[21] Appl. No.: 866,822

[22] Filed: May 29, 1986

Related U.S. Application Data

[62] Division of Ser. No. 727,469, Apr. 26, 1985, Pat. No. 4,612,275.

[51] Int. Cl.⁴ .............. G03C 5/00; G03C 1/495; G03C 1/46; G03C 1/94
[52] U.S. Cl. .............................. 430/312; 430/271; 430/276; 430/502; 430/523; 430/942; 156/643
[58] Field of Search .............. 430/271, 273, 275, 276, 430/296, 312, 502, 523, 524, 525, 942; 156/643

[56] References Cited

U.S. PATENT DOCUMENTS

| | | | |
|---|---|---|---|
| 4,165,395 | 8/1979 | Chang | 427/43 |
| 4,362,598 | 12/1982 | Griffing | 156/643 |
| 4,493,855 | 1/1985 | Sachdev et al. | 427/41 |
| 4,494,004 | 1/1985 | Mauer, IV et al. | 250/492.2 |
| 4,612,275 | 9/1986 | Gregor | 430/296 |

Primary Examiner—Richard R. Bueker
Assistant Examiner—Patrick J. Ryan
Attorney, Agent, or Firm—John A. Stemwedel

[57] ABSTRACT

The present invention discloses multi-layered resist structures and methods of producing them which can be used in electronic device lithography to produce micrometer and submicrometer geometries.

The resist structure comprises two or more layers at least one of which is a metallic material and at least one of which is a radiation-sensitive material. The metallic layer exhibits both a high atomic number and a high density. The metallic material is positioned relative to the radiation-sensitive polymeric material so that it can be used to control reflection and backscatter of radiation used to create a latent image within the radiation-sensitive polymeric material. The thickness of the metallic layer is determined by the amount of reflection desired and the amount of backscatter permitted into the layer of radiation-sensitive polymeric material.

5 Claims, 4 Drawing Sheets

MULTILAYER RESISTS WITH IMPROVED SENSITIVITY AND REDUCED PROXIMITY EFFECT

This application is a division of 06/727,469 issued 04/26/85 now U.S. Pat. No. 4,612,275.

BACKGROUND OF THE INVENTION

1. Technical Field

The present invention is concerned with multilayer resist structures and methods of producing them which can be used in electronic device lithography to produce micrometer and submicrometer geometries.

2. Background Art

Electron beam lithography is one of the most promising methods for producing the micrometer and submicrometer geometries desired in electronic devices. However, a significant problem in electron beam lithography has been the effect of electron backscattering in the radiation-sensitive organic resist film, which has placed practical limitations on the resolution and line width control, due to proximity effects and resist thickness variations over the substrate topography. A lesser degree of radiation scattering may occur when the radiation source is X-ray.

The effects of electron scattering in an organic resist film on various substrates is described by Parikh et. al. in "Energy deposition functions in electron resist films on substrates", Journal of Applied Physics 50(2), February 1979, pp. 1104–1111.

The effect of multi-layer resists on electron scattering, and hence the proximity effect, is discussed by J.S. Greeneich in "Proximity Effects in Electron-Beam Exposure of Multi-Layer Resists" Proceedings Symposium, Electron and Ion Beam Science and Technology, 9th International Conference 282, Electrochemical Society (1980). This paper discusses the effect of using a thin layer (specifically 500 Å) of aluminum as part of a multi-layer structure. The calculated data for the multi-layer resist indicate that when a thin layer of aluminum is used as an intermediate layer between upper and lower layers of polymeric resist, for a given dosage of radiation, the overall exposure of the upper layer of resist is increased. Thus, the reflection back (of radiation) from the aluminum layer is greater than the reflection back from a typical multi-layer structure comprising a second layer of resist atop a silicon substrate.

A method of using multilayer resist systems in electron beam lithography in order to create a high aspect ratio structure (with a large height-to-line width ratio) is described in U.S. Pat. No. 4,165,395 to Chang. A method for producing high resolution patterns in a thick layer of polymeric material is described in U.S. Pat. No. 4,362,598 to Griffing. Both of these patents refer to three layer resist structures wherein the upper and lower layers are polymeric material and the intermediate layer is a metal which is used as a mask for the lower resist layer during practice of the method. In Chang, the metallic intermediate layer acts as a mask during exposure of the lower resist layer to actinic radiation. In Griffing, the metallic intermediate layer acts as a mask during exposure of the lower resist layer to reactive ion etching in oxygen.

SUMMARY OF THE INVENTION

In accordance with the present invention, multi-layer resist structures and methods of producing them, which can be used in electronic device lithography to produce micrometer and submicrometer geometries is disclosed. The structures and methods disclosed provide for a multilayer resist, comprising two or more layers, at least one of which is a metallic material and at least one of which is a radiation-sensitive material. The metallic layer exhibits both a high atomic number and a high density. The atomic number of the metallic material ranges from about 60 to about 84, and the density ranges from about 12 to about 23 g/cm$^3$. The thickness of the metallic layer ranges from about 300 Å to about 4,000 Å, with a preferred thickness range from about 400 Å to about 2,000 Å. The metallic layer is positioned with reference to the radiation-sensitive material so that it can be used to reflect back radiation used to create a latent image within the radiation-sensitive resist, thus increasing the effective sensitivity of the resist. In addition, the metallic layer is used to control the amount and direction of backscatter of the radiation from underlying structure, thus decreasing the proximity effect within the radiation-sensitive resist. The layer of metal can also be used to prevent charging during imaging via electron beam radiation, to protect the lower polymeric resist layer and underlaying substrate from the imaging radiation, and to serve as a mask for subsequent processing of the lower polymeric resist layer.

The major effect of the metallic layer in the reduction of intraproximity effect appears to be the controlling of the amount of and direction of electron backscatter from the interface between the upper polymeric resist and the metallic interlayer and from beneath the metallic interlayer. The amount of and direction of backscatter depend upon the atomic number and density of the metal used and the thickness of the metallic layer. In order to be effective in reducing the intraproximity effect, the metal or metal alloy used to produce the metallic interlayer must exhibit both a high atomic number (from about 60 to about 84) and a high density (from about 12 to about 23 g/cm$^3$). Metals meeting this requirement include: hafnium, tantalum, tungsten, rhenium, osmium, iridium, platinum, gold, mercury, thallium, lead, and alloys thereof. An alloy of a metal not included within this group with a metal included within this group can be used so long as the alloy has the characteristics described. preferred among the metals listed above are tantalum, tungsten, rhenium, osmium, iridium, platinum and gold, due to their high densities (ranging from about 17 to about 23 g/cm$^3$).

For any of the metals given above, the thickness of the metal layer can be tailored to meet specific backscattering requirements. Backscattering requirements depend on a number of factors, such as the polymeric resist used for the upper layer, the required geometry dimensions within the resist structure and underlaying substrate, the radiation source, the dosage of the radiation, and the amount of reflection desired to increase sensitivity within the upper layer of polymeric resist. For practical electron beam lithography, which requires that the current generated by topographical indicators in the substrate be detected for alignment purposes, the limit on thickness of the metallic interlayer will probably be within the range of 400 to 2,000 Å.

One of the preferred embodiments of the present invention utilizes a multi-layer resist structure comprising a three layer resist upon an electronic device substrate. The three layers include upper and lower layers of polymeric resists and a metallic interlayer comprised of a metallic material of the type described above. The upper layer of polymeric resist is sensitive to electron beam (E-beam) radiation, and a number of polymeric materials are suitable resists, such as polysulfone-novolaks, diazoquinone-novolaks, polymethyl-methacrylates, and polysiloxanes. The lower layer of polymeric resist can be any of those commonly used in the lithographic industry. However, for many applications, it is preferred that this lower layer exhibit good thermal stability, and examples of materials preferred for this layer include baked novolaks, polyimides, and polyarylsulfones.

The method of the present invention provides for production of a multi-layer resist structure for use in the creation electronic devices, comprising the steps of:

(a) applying a thin layer of metallic material to the surface of a substrate, wherein the metallic layer is comprised of a metal or metal alloy exhibiting both a high atomic number and a high density, and wherein the thickness of the metallic layer is determined by the amount of reflection of radiation striking said metallic layer surface and the amount of radiation backscatter from said metallic layer and underlaying structure; and (b) applying a layer of radiation-sensitive polymeric material in a position relative to said metallic layer so that said metallic layer can be used to control reflection and backscatter of radiation used to create a latent image within said radiation-sensitive polymeric material.

The substrate can be a resist material; the resist material can be either insensitive or sensitive to radiation, depending on the application. The radiation to which the substrate resist material is sensitive may differ from the radiation described above in step (b).

The radiation source used to image the radiation-sensitive resist of step (b), is selected from the group consisting of E-beam of X-ray; however, E-beam is preferred for economy of pattern formation.

The type of metal used and thickness of the metallic layer applied in step (a) depends primarily on the amount of radiation backscattering permitted; included among the variables considered are composition of the radiation-sensitive resist, the source and dosage of the imaging radiation, the desired image dimensions, and the need to protect the substrate beneath the metallic layer.

DESCRIPTION OF THE PREFERRED EMBODIMENTS

The multi-layered resist structure of the present invention is comprised of two or more layers, at least one of which is a thin metallic layer and at least one of which is a radiation-sensitive polymeric material. The at least one layer of radiation-sensitive polymeric material is applied so that it contacts the surface of the at least one thin metallic layer, and, when patterned E-beam radiation strikes the radiation-sensitive polymeric material, penetrating its surface, the metallic layer can be utilized to control the amount of backscatter of the radiation within the radiation-sensitive polymeric material. The radiation source can be electron beam, or X ray, but electron-beam is preferred for economy of pattern formation.

Figure 1:
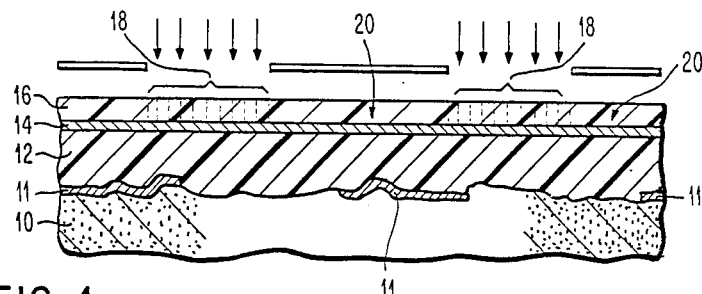
FIGS. 1-4 depict a method of using a multi-layer resist system of the type disclosed in the present invention. A three layer resist system is applied over the surface of a substrate. The upper layer is a radiation-sensitive positive resist, the intermediate layer is a thin metallic layer of the type previously described, and the lower layer is a polymeric material which may be either insensitive or sensitive to radiation. The upper, radiation-sensitive positive resist is exposed to electron-beam radiation and then developed to create a pattern upon the surface of the thin metallic layer. The pattern is stransferred from the positive resist to the thin metallic layer, and finally the pattern is transferred from the thin metallic layer to the lower resist layer.

Referring now to FIG. 1, a lower layer of polymeric resist material 12 is applied to the surface of an electronic device substrate 10 including any overlaying structure 11, such as silicon oxide. A thin layer of metal 14 ranging from about 400 Å to about 2,000 Å in thickness is then applied over the surface of the polymeric resist material 12. Subsequently, an upper layer of radiation-sensitive polymeric resist material 16 is applied over the surface of the metallic layer 14. Patterned E-beam radiation is next applied to the surface of the radiation-sensitive resist 16, creating a latent image 18 within the radiation-sensitive resist 16. By using the proper layer thickness of a metal with a high atomic number (ranging from about 60 to 84) and a high density (ranging from about 12 to 23 g/cm$^3$), the amount of and direction of backscatter can be controlled. The amount of backscatter from reflective underlaying structure 12, 11, 10 is limited, and the amount of backscatter and apparently, to some extent, direction of backscatter from the surface 20 of the metallic layer 14 is controlled. Since the surface 20 of the metallic layer 14 is a relatively constant distance from the radiation source, compared with the substrate 10 which has a varying topography, control of the overall direction of the backscatter is particularly improved. This control of the amount and direction of backscatter permits increased radiation into the desired pattern area via reflection back from the metallic surface 20, with simultaneous reduction of intraproximity effects which occur when significant amount of backscatter are directed to areas outside the desired pattern, particularly from underlaying structure 12, 11, 10. In addition, it is possible to vary the material makeup of the substrate 10 without affecting the radiation dosage necessary for creating the latent image within the radiation-sensitive resist 16.

Figure 2:
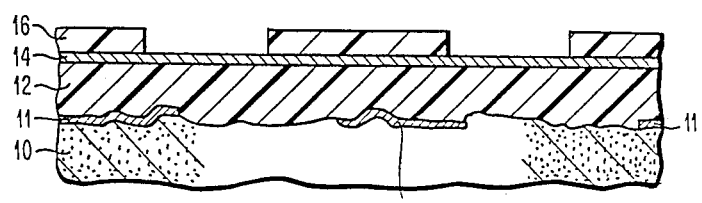

Once the pattern is formed as a latent image within the radiation-sensitive resist 16, the resist is developed as shown in FIG. 2, wherein the radiation-sensitive resist is a positive resist and a positive relief pattern is created. (The irradiated material is removed upon development).

Figure 3:
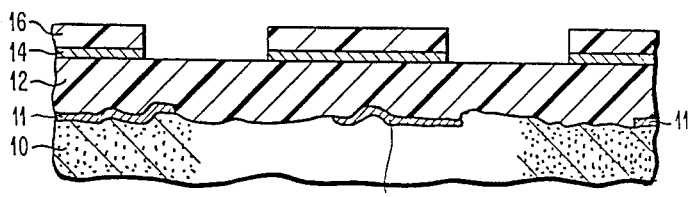

The pattern is then transferred through the metallic layer 14, as shown in FIG. 3, using chemical wet etch techniques or dry etch techniques appropriate for the particular metal or alloy of metals used for this layer. FIG. 3 shows the polymeric layer 16 remaining after this transfer step. Depending on the method used to accomplish the transfer, it is possible for most of the polymeric layer 16 to be removed during this transfer step.

Figure 4:
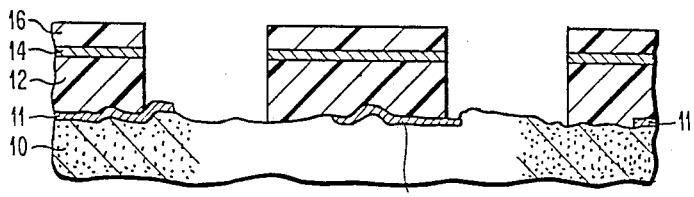

Finally, the pattern is transferred through the lower layer of polymeric resist 12 to the substrate 10, as shown in FIG. 4. If the method of pattern transfer through the lower layer of polymeric resist material 12 is oxygen plasma or oxygen reactive ion etching, it is not necessary for the lower layer of polymeric resist material 12 to be radiation-sensitive. If the method to be used to transfer the pattern requires wet chemical development procedures, it may be desirable (although not necessary) to have a lower resist layer 12 which is sensitive to radiation. Radiation can then be used to render the lower resist layer 12, which is not protected by the patterned metallic layer 14, more soluble in chemical developers. The radiation used to increase the solubility of the non-protected lower resist layer may be actinic radiation. For any of the proposed methods of pattern transfer, the pattern in the upper layer of polymeric material 16, from which all subsequent patterns are transferred is micron or submicron in dimension.

Figure 5:
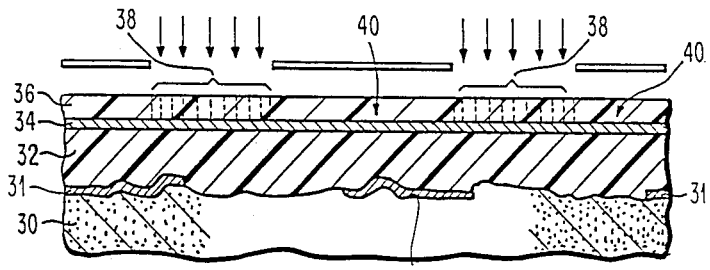
FIGS. 5-8 depict a method of using a multi-layer resist system comprising three layers applied over the surface of a substrate. The upper layer is a radiation-sensitive negative resist, the intermediate layer is a thin metallic layer of the type previously described, and the lower layer is a polymeric material which may be either insensitive or sensitive to radiation. The steps in the method are essentially the same as those depicted in FIGS. 1-4 except that the pattern created is that of the irradiated and developed negative resist.

Referring now to FIG. 5, a lower layer of polymeric resist material 32 is applied to the surface of an electronic device substrate 30 including any overlaying structure 31, such as silicon oxide. A thin layer of metal 34 ranging from about 400 Å to 2,000 Å in thickness is then applied over the surface of the polymeric resist material 32. Subsequently, an upper layer of radiation-sensitive polymeric resist material 36 is applied over the surface of the metallic layer 34. Patterned E-beam radiation is next applied to the surface of the radiation-sensitive resist 36, creating a latent image 38 within the radiation-sensitive resist 36. By using the proper metallic layer thickness and metallic material, as previously described, the amount of and direction of radiation backscatter can be controlled in order to provide micron and submicron dimension latent images within the radiation-sensitive resist 36.

Figure 6:
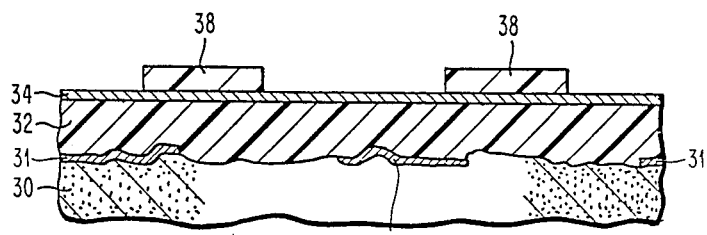

Once the pattern is formed as a latent image within the radiation-sensitive resist 36, the resist is developed as shown in FIG. 6, wherein the radiation-sensitive resist is a negative resist and a negative relief pattern is created. (The non-irradiated material is removed upon development).

Figure 7:
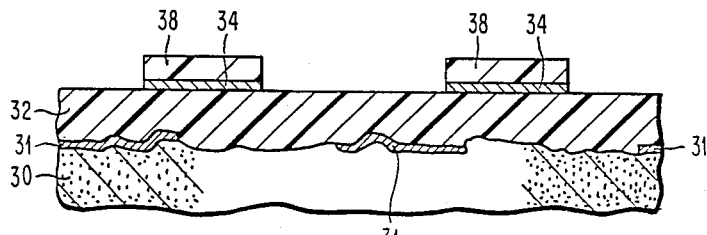

The pattern is then transferred through the metallic layer 34, as shown in FIG. 7, using chemical wet etch techniques or dry etch techniques appropriate for the particular metal or alloy of metals used for this layer. FIG. 7 shows polymeric layer 38 remaining after transfer of the pattern to the metallic layer 34. Depending on the method used to transfer the pattern, most of the polymeric layer 38 may be removed during transfer of the pattern.

Figure 8:
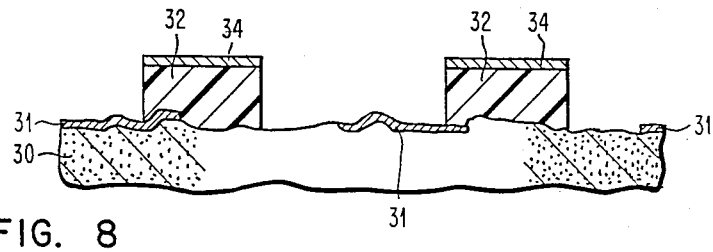

Finally, the pattern is transferred through the lower layer of polymeric resist 32 to the substrate 30, as shown in FIG. 8. If the method of pattern transfer through the lower layer of polymeric resist material 32 is oxygen plasma or oxygen reactive ion etching, it is not necessary for the lower layer of polymeric resist material 32 to be radiation-sensitive. In addition, use of oxygen plasma or ion etching would very likely result in removal of the upper layer of polymeric material 38 simultaneously with removal of lower layer polymeric material 32 in areas not protected by the metallic layer (mask). Thus, the final structure can be as shown in FIG. 8. It is also possible to use wet development techniques to remove the lower layer polymeric material 32 which is not protected by the metallic layer 34. When the method used to transfer the pattern from the metallic layer 34 to the lower polymeric layer 32 is a wet development process, the lower layer of polymeric material can be insensitive to radiation, or sensitive to radiation. In the latter case, exposure of the lower layer of polymeric material 32 through the metallic layer 34 (mask) is used to render exposed areas of the polymeric material 32 more soluble in the developer.

EXAMPLES

EXAMPLE 1

A lower layer of polyarylsulfone resin was applied over the surface of a silicon substrate using standard spin coating techniques, followed by oven bake at 275° C. to remove solvent remaining after the coating application. Thickness of the polyarylsulfone layer after solvent removal was about 15,000 Å. Subsequently, a 400 Å thick layer of gold was applied over the layer of polyarylsulfone; the gold was applied using sputtering techniques. Next, an upper layer of polysulfone-novolak resist was applied over the surface of the layer of gold using standard spin coating techniques, followed by oven bake at 100° C. to remove solvent remaining after the coating application. Thickness of the polysulfone-novolak layer after solvent removal was about 5,000 Å.

The surface of the upper layer of the above multilayer resist was then exposed to patterned E-beam radiation using an E-beam tool of the type described in U.S. Pat. No. 4,494,004, at a dosage of $5\mu C/cm^2$. The latent image created within the upper layer of polysulfone-novolak resist was developed using AZ-2401 alkaline developer, to create a pattern upon the surface of the layer of gold.

The pattern was transferred from the upper resist layer of polysulfone-novolak to the gold layer using sputtering techniques. Subsequently, the pattern was transferred from the gold layer to the lower polyarylsulfone layer using oxygen reactive ion etching.

The dimensions of the pattern obtained in the upper resist layer were about 1.5 micrometers. The dimensions of the transferred pattern at the substrate surface were about 1.4±0.1 micrometers. Dimensions for the same polymeric resist system without the gold interlayer, processed in the same manner, were about 1.7 micrometers.

EXAMPLE 2

Figure 9:
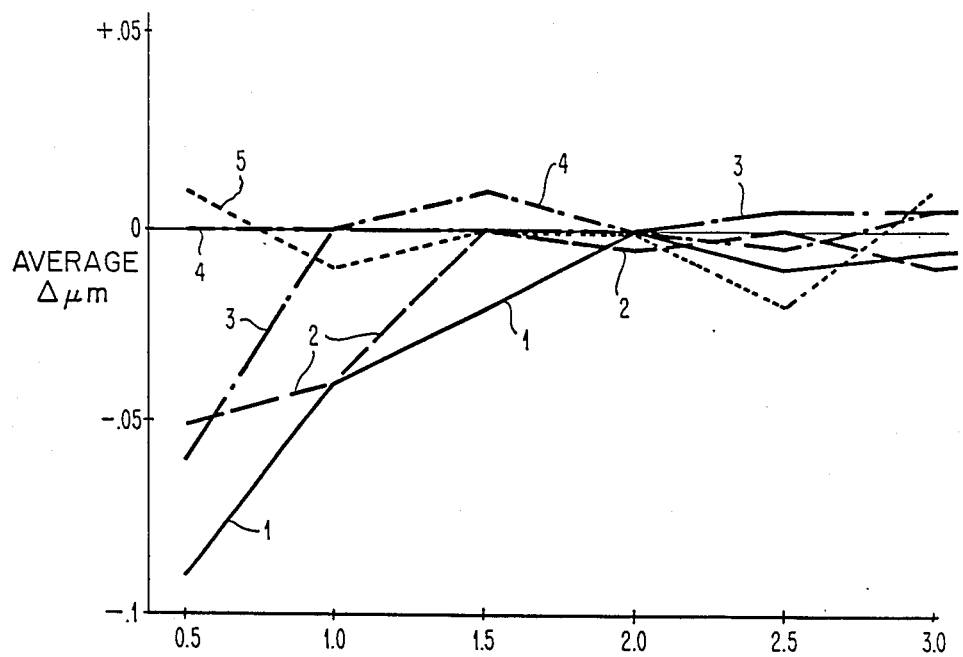

The effect of a thickness change in the gold layer on the line width variation of the pattern (after transfer to the substrate level) was measured using isolated line arrays. The line arrays were produced using a three layer resist system and an E-beam radiation source. The substrate was a silicon wafer. The lower resist layer was a polyarylsulfone approximately 15,000 Å thick. The layer of gold was applied at different thicknesses varying from 400 Å to 2000 Å. The upper resist layer was a polysulfone-sensitized novolak approximately 5,000 Å thick. Line images 1 micrometer in width were created within the upper resist layer using the E-beam tool of EXAMPLE 1 at a dosage of $2.5\mu C/cm^2$. The line images in the upper resist layer were developed using AZ-2401 alkaline developer. The developed pattern in the upper resist layer was transferred through the gold layer using sputtering techniques. Subsequently, the pattern was transferred from the gold layer through the lower polyarylsulfone resist layer using oxygen reactive ion etching. The graph in FIG. 9 shows the average variation in polysulfone-novolak resist line width in micrometers (Δμm), as a function of proximity of the lines in micrometers and as a function of the thickness of the gold layer in angstroms. The reference numbers of each plot on the graph represent the following: 1=400 Å of gold thickness, 2=800 Å, 3=1200 Å, 4 =1600 Å, and 5=2000 Å. Note that for the 1 micrometer line patterns wherein spacing between lines is 1.5 micrometers or less, the variation in line width due to intraproximity effect is significantly affected by the thickness of the gold interlayer. Within experimental error, at a line spacing of 1.5 micrometers, a gold layer thickness of 800 Å or more (up to 2,000 Å) prevents line width variation of more than 0.01 micrometers; at a line spacing of 1.0 micrometers, a gold layer thickness of 1,200 Å or more prevents line width variation of more than 0.01 micrometers; at a line spacing of 0.5 micrometers, a gold layer thickness of 1,600 Å or more prevents line width variation of 0.01 micrometers or more.

EXAMPLE 3

The effect of a thickness change in the gold layer on reflected E-beam radiation was measured in terms of time required to develop the latent image in the upper, radiation-sensitive resist material. A positive resist was used for the radiation-sensitive resist material, and a constant E-beam radiation dose, so that a longer development time indicates less reflected radiation. Two different three layer resist systems were examined by this method.

The substrate used in both cases was a silicon wafer. The first three layer resist system was comprised of a lower resist layer of polyarylsulfone approximately 15,000 Å thick, an intermediate layer of gold at different thicknesses varying from 400 Å to 2,000 Å, and an upper resist layer of polysulfone-sensitized novolak approximately 5,000 Å thick. The second three layer resist system was comprised of a lower resist layer of polyarylsulfone approximately 15,000 Å thick, an intermediate layer of gold at different thicknesses varying from 400 Å to 2,000 Å, and an upper resist layer of diazoquinone-sensitized novolak approximately 10,000 Å thick. Line images 1.0 to 5.0 micrometers in width were created within the upper resist layer using an E-beam tool of the type described in U.S. Pat. No. 4,494,004, at a dosage of 5μC/cm².

Figure 10:
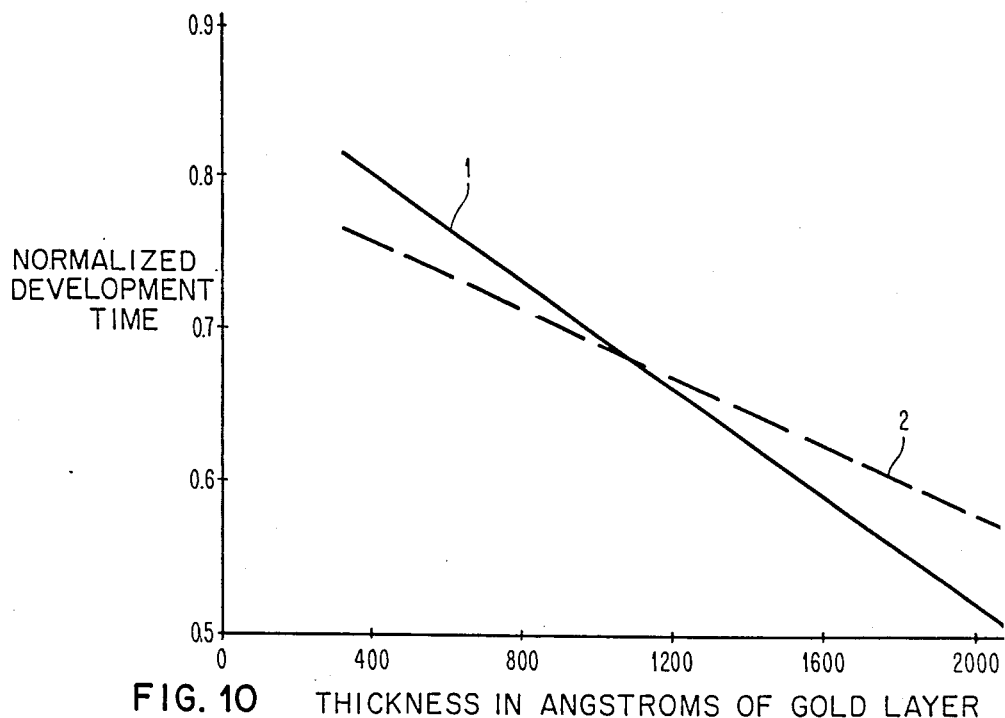

The images in the upper radiation-sensitive resist layer were developed using AZ-2401 alkaline developer in both cases. FIG. 10 shows the increase in reflected radiation, in terms of reduction in normalized development time, as a function of increasing thickness of the gold layer. Reference number 1=the three layer resist system employing the polysulfone-sensitized novolak as the upper resist layer. Reference number 2=the three layer resist system employing the diazoquinone-sensitized novolak as the upper resist layer.

EXAMPLE 4

Use of the metallic layer to reflect E-beam radiation, thus increasing the effective sensitivity of the radiation-sensitive resist, was also measured using a 1,000 Å thick tungsten interlayer. The radiation-sensitive resist was a diazoquinone-sensitized novolak. All other materials, procedures, and dimensions were essentially equivalent to those described in EXAMPLE 3. The increase in effective sensitivity of the diazoquinone-sensitized resist is shown in Table I below, in terms of development time to end point for the upper layer of diazoquinone-sensitized resist with and without the tungsten interlayer.

TABLE I

| Sample Description | Development Time, Seconds |
| --- | --- |
| 1. Upper Layer = diazoquinone-sensitized novolak<br>Intermediate Layer = silicon oxide<br>Lower Layer = polyarylsulfone | 630, 655 |
| 2. Upper Layer = diazoquinone-sensitized novolak<br>Intermediate Layer = tungsten<br>Lower Layer = polyarylsulfone | 368, 405, 360 |

EXAMPLE 5

Figure 11:
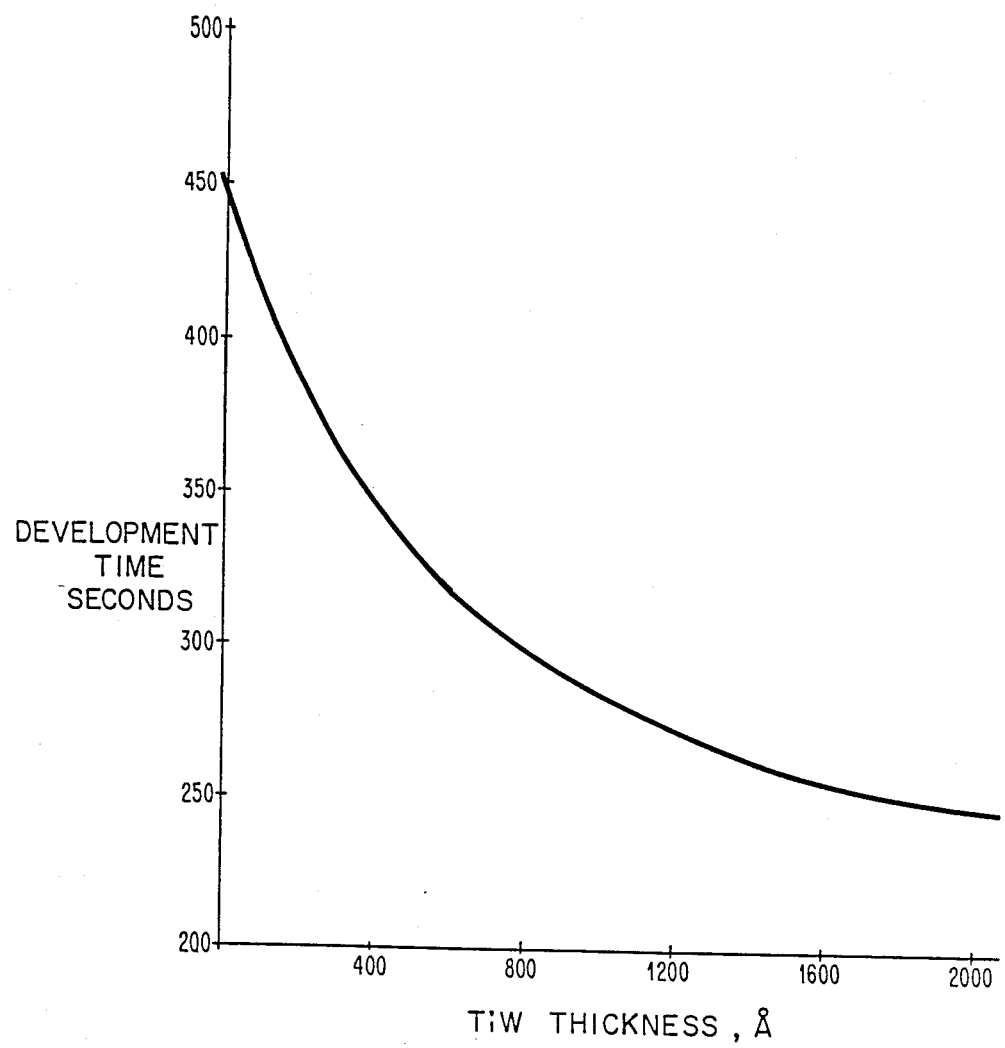

A metallic layer comprised of a tungsten-titanium alloy was used to reflect E-beam radiation, thus increasing the effective sensitivity of the radiation-sensitive resist. The effect of a thickness change in the metallic alloy layer was measured, and the results are shown in FIG. 11. The metallic alloy layer was comprised of about 91% tungsten and about 9% titanium, so that the effective atomic number was approximately 69 and the effective density was approximately 18 g/cm³. The expected electron reflecting properties are only slightly less than those of pure tungsten. The radiation-sensitive resist was a diazoquinone-sensitized novolak. All materials, procedures and dimensions other than those described above were essentially equivalent to those described in EXAMPLE 3. FIG. 11 shows the increase in effective sensitivity of the diazoquinone-novolak (in terms of decrease in development time) with increasing tungsten-titanium layer thickness.

The above examples present the best modes contemplated for carrying out typical applications of the present invention. This invention is, however, susceptible to modification and alternate constructions from the embodiments shown. Consequently, it is not intended to limit this invention to the particular embodiments disclosed. On the contrary the intent is to cover all modifications and alternate constructions falling within the spirit and scope of the invention as expressed in the appended claims.

What is claimed is:

1. A method of producing a multi-layer resist structure for use in fabrication of electronic devices, comprising the steps of:
   (a) Applying a thin layer of a metal or an alloy of said metal to the surface of a substrate, wherein the atomic number of said metallic layer ranges between about 60 and about 84 and the density of said metallic layer ranges between about 12 g/cm² and about 23 g/cm², and wherein the thickness of said metallic layer ranges between about 400 Å and about 4,000 Å;
   (b) applying a layer of radiation-sensitive polymeric material over the surface of said metallic layer; and
   (c) exposing the surface of said radiation-sensitive polymeric material to patterned radiation to create a latent image within said radiation-sensitive polymeric material.

2. The method of claim 1 wherein said substrate is a polymeric material.

3. The method of claim 2 wherein said substrate polymeric material is selected from the group consisting of baked novolaks, polyimides, and polyarylsulfones.

4. The method of claim 1 wherein said metal is comprised of a metallic material selected from the group consisting of hafnium, tantalum, tungsten, rhenium, lead, and alloys of metals within said group.

5. The method of claim 1 wherein said radiation-sensitive polymeric material is comprised of a resist material selected from the group consisting of polysulfone-novolaks, diazoquinone-novolaks, polymethylmethacrylates, and polysiloxanes.

* * * * *

UNITED STATES PATENT AND TRADEMARK OFFICE
CERTIFICATE OF CORRECTION

PATENT NO. : 4,745,044

DATED : May 17, 1988

INVENTOR(S) : Lawrence V. Gregor

It is certified that error appears in the above-identified patent and that said Letters Patent is hereby corrected as shown below:

Column 9, line 3, change "hafmum" to --hafnium--.

Signed and Sealed this

Eighth Day of November, 1988

Attest:

DONALD J. QUIGG

*Attesting Officer*  *Commissioner of Patents and Trademarks*